(12) United States Patent
Ko et al.

(10) Patent No.: US 11,004,677 B2
(45) Date of Patent: May 11, 2021

(54) METHOD FOR FORMING METAL OXIDE LAYER, AND PLASMA-ENHANCED CHEMICAL VAPOR DEPOSITION DEVICE

(71) Applicant: Samsung Display Co., Ltd., Yongin-si (KR)

(72) Inventors: Dong Kyun Ko, Hwaseong-si (KR); Woo Jin Kim, Hwaseong-si (KR); In Kyo Kim, Seongnam-si (KR); Keun Hee Park, Seoul (KR); Suk Won Jung, Sejong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 86 days.

(21) Appl. No.: 16/103,116

(22) Filed: Aug. 14, 2018

(65) Prior Publication Data

US 2019/0051520 A1 Feb. 14, 2019

(30) Foreign Application Priority Data

Aug. 14, 2017 (KR) .................. 10-2017-0103137

(51) Int. Cl.
*H01L 21/02* (2006.01)
*H01L 21/28* (2006.01)
(Continued)

(52) U.S. Cl.
CPC ...... *H01L 21/02274* (2013.01); *C23C 16/405* (2013.01); *C23C 16/455* (2013.01);
(Continued)

(58) Field of Classification Search
CPC ......... H01L 21/02274; H01L 21/28202; H01L 23/5222; H01L 21/0228; H01L 21/02172;
(Continued)

(56) References Cited

U.S. PATENT DOCUMENTS 5,304,407 A * 4/1994 Hayashi ............... C23C 16/452
427/255.5
5,643,638 A * 7/1997 Otto ....................... C08J 7/123
427/569
(Continued)

FOREIGN PATENT DOCUMENTS

KR 100483282 B1 4/2005
KR 1020060091908 A 8/2006
(Continued)

OTHER PUBLICATIONS

Young. Hugh D. and Freedman Roger A, University Physics, Pierson, 12-th Edition; pp. 1104-1105 (Year: 2008).*
(Continued)

*Primary Examiner* — Laura M Menz
(74) *Attorney, Agent, or Firm* — Cantor Colburn LLP

(57) ABSTRACT

A method and a device for forming a highly dielectric metal oxide layer. The method includes repeatedly causing a plasma-off period and a plasma-on period while an organic metal compound and an oxidizing agent are continuously injected into a chamber. One cycle includes one plasma-off period and one plasma-on period. During the plasma-off period, a physical and chemical adsorption layer including an organic metal compound and a plurality of atomic layers is formed on a substrate. During the plasma-on period, a metal oxide layer that is thicker than two atomic layers is formed by a chemical reaction of metal atoms in the physical and chemical adsorption layer and oxygen atoms in the oxidizing agent.

20 Claims, 16 Drawing Sheets

(51) Int. Cl.
*H01L 23/522* (2006.01)
*H01J 37/32* (2006.01)
*C23C 16/455* (2006.01)
*C23C 16/40* (2006.01)
*C23C 16/517* (2006.01)

(52) U.S. Cl.
CPC ...... *C23C 16/45565* (2013.01); *C23C 16/517* (2013.01); *H01J 37/3244* (2013.01); *H01J 37/32137* (2013.01); *H01J 37/32146* (2013.01); *H01J 37/32449* (2013.01); *H01L 21/28202* (2013.01); *H01L 23/5222* (2013.01)

(58) Field of Classification Search
CPC ......... H01L 21/02181; H01L 21/02112; H01L 21/28194; H01L 29/517; H01J 37/32137; H01J 37/3244; H01J 37/32449; H01J 37/32146; C23C 16/45565; C23C 16/405; C23C 16/517; C23C 16/455; C23C 16/40; C23C 16/50; C23C 16/52; C23C 16/45536; C23C 16/4554; C23C 16/45504
See application file for complete search history.

(56) References Cited

U.S. PATENT DOCUMENTS

| | | | |
|---|---|---|---|
| 2004/0026374 A1* | 2/2004 | Nguyen | H01L 21/67173 216/89 |
| 2004/0116080 A1* | 6/2004 | Chen | H01J 37/32174 455/115.1 |
| 2008/0199632 A1 | 8/2008 | Wolden et al. | |
| 2010/0075510 A1 | 3/2010 | Jan et al. | |
| 2011/0247559 A1 | 10/2011 | Liu et al. | |
| 2011/0293854 A1* | 12/2011 | Takizawa | H01J 37/32935 427/569 |
| 2012/0052693 A1* | 3/2012 | Ozaki | C23C 16/402 438/771 |
| 2013/0292835 A1 | 11/2013 | King et al. | |
| 2014/0272185 A1 | 9/2014 | Na et al. | |
| 2015/0232992 A1 | 8/2015 | Kim et al. | |
| 2016/0336174 A1 | 11/2016 | Underwood | |

FOREIGN PATENT DOCUMENTS

| | | |
|---|---|---|
| KR | 1020080036273 A | 4/2008 |
| KR | 100852234 B1 | 8/2008 |
| KR | 100997110 B1 | 11/2010 |
| KR | 101121202 B1 | 2/2012 |

OTHER PUBLICATIONS

Extended European Search Report dated May 23, 2019, of the corresponding European Patent Application No. 18189051.8.
Il-Kwon Oh et al., "Supplementary data for Very High Frequency Plasma Reactant for Atomic Layer Deposition," Applied Surface Science, Jun. 14, 2016, pp. 1-7, vol. 387.
Oh Il-Kwon et al. "Very high frequency plasma reactant for atomic layer deposition,"Applied Surface Science, Jun. 14, 2016, pp. 109-117, vol. 387.
Jung Hanearl et al., "Comparative study on growth characteristics and electrical properties of ZrO2 films . . . ", Journal of Vacuum Science and Technology, Apr. 28, 2017, vol. 35, No. 3, pp. 031510-1~031510-8.
Mathur S et al., "CVD of titanium oxide coatings: Comparative evaluation of thermal and plasma assisted processes", Surface and Coatings Technology, Elsevier BV, Amsterdam, NL, vol. 201, No. 3-4, Oct. 5, 2006, pp. 807-814.
Satoshi Tanimoto et al., "Synchronously Excited Discrete Chemical Vapor Deposition of TaO5", Journal of the Electrochemical Society, Electrochemical Society, vol. 141, No. 5, May 1, 1994, pp. 1339-1346.
Seman M T et al., "An analysis of the deposition mechanisms involved during self-limiting growth of aluminum oxide by pulsed PECVD", Chemical Vapor Deposition, Sep. 1, 2008, vol. 14, No. 9/10, pp. 296-302.
Seman Michael et al., "Enhancement of metal oxide deposition rate and quality using pulsed plasma-enhanced chemical vapor deposition at low frequency", Journal of Vacuum Science and Technology, Aug. 6, 2008, vol. 26, No. 5, pp. 1213-1217.
Szymanski Scott et al., "Effect of wall conditions on the self-limiting deposition of metal oxides by pulsed plasma-enhanced chemical vapor deposition", Journal of Vacuum Science and Technology, Sep. 10, 2007, vol. 25, No. 6, pp. 1493-1499.
The partial European Search Report dated Jan. 15, 2019, of the corresponding European Patent Application No. 18189051.8.

* cited by examiner

METHOD FOR FORMING METAL OXIDE LAYER, AND PLASMA-ENHANCED CHEMICAL VAPOR DEPOSITION DEVICE

RELATED APPLICATIONS

This application claims priority to and the benefit of Korean Patent Application No. 10-2017-0103137 filed in the Korean Intellectual Property Office on Aug. 14, 2017, and all the benefits accruing therefrom under 35 U.S.C. § 119, the content of which is incorporated herein in its entirety by reference.

BACKGROUND

1. Field

The present disclosure relates to a method for forming a metal oxide layer, and a plasma-enhanced chemical vapor deposition (PECVD) device for forming a metal oxide layer.

2. Description of the Related Art

As the resolution of displays has increased, pixels are becoming smaller, and it is gradually becoming more difficult to provide acceptable capacitance as the size of capacitors is reduced. A dielectric layer of a conventional capacitor includes a silicon oxide or a silicon nitride, and is generally formed by a chemical vapor deposition (CVD) method.

Capacitors using metal oxide layers such as a zirconium oxide, a titanium oxide, or a hafnium oxide may have a greater dielectric constant than the silicon oxide and the silicon nitride as dielectric layers. The metal oxide layers with high dielectric constant may be formed by an atomic layer deposition (ALD) method.

A conventional atomic layer deposition process includes a first operation for chemically adsorbing an organic metal compound on a substrate, a second operation for removing (purging) a remaining organic metal compound, a third operation for allowing metal atoms of the adsorbed organic metal compound and oxygen atoms of an oxidizing agent to undergo a chemical reaction to form an atomic layer of a metal oxide, and a fourth operation for removing (purging) a by-product.

The aforementioned first operation to fourth operation make up one cycle, and the cycle is repeated until a desirable thickness of film is obtained. The atomic layer deposition method provides excellent quality of films, but the film forming speed of the atomic layer deposition method is very slow, for example, 10 angstroms (Å) to 20 Å per minute (min), so the atomic layer deposition method may require many minutes, for example, several tens of minutes, to form the dielectric layer with a desired thickness for the display and the atomic layer deposition method is disadvantageous in mass production.

The above information disclosed in this Background section is only for enhancement of understanding of the background of the described technology and therefore it may contain information that does not form the prior art that is already known in this country to a person of ordinary skill in the art.

SUMMARY

The described technology has been made in an effort to provide a method for forming a metal oxide layer for increasing a film forming speed, and a plasma-enhanced chemical vapor deposition device for forming a metal oxide layer when forming a highly dielectric metal oxide layer.

An exemplary embodiment provides a method for forming a metal oxide layer, the method including repeatedly causing a plasma-off period and a plasma-on period while an organic metal compound and an oxidizing agent are continuously injected into a chamber, one cycle including one plasma-off period and one plasma-on period. During the plasma-off period, a physical and chemical adsorption layer including an organic metal compound with 2 or more atomic layers is formed on a substrate. During the plasma-on period, a metal oxide layer that is thicker than two atomic layers is formed by a chemical reaction of metal atoms in the physical and chemical adsorption layer and oxygen atoms in the oxidizing agent.

The plasma-off period and the plasma-on period may have a same duration, and an intensity of plasma may have a constant value during plasma-on periods.

The plasma-on period may have a longer duration than the plasma-off period, and the intensity of plasma may have a constant value during plasma-on periods. The plasma-on period may have a duration that is longer in proportion to an increase of the number of cycles.

The plasma-off period and the plasma-on period may have a same duration, and the intensity of plasma may increase in proportion to the increase of the number of cycles during plasma-on periods.

Plasma-on periods may have a duration that increases in proportion to an increase in a number of cycles, and an intensity of plasma during plasma-on periods may increase in proportion to an increase in the number of cycles.

The organic metal compound and the oxidizing agent may be injected into the chamber by separate pipes, and the organic metal compound may pass through at least one diffuser and is provided to the substrate.

An embodiment provides a method for forming a metal oxide layer includes performing an adsorption and stabilization operation and a plasma film forming operation. The adsorption and stabilization operation includes injecting an organic metal compound and an oxidizing agent into a chamber, and forming a physical and chemical adsorption layer including the organic metal compound with 2 or more atomic layers on a substrate. The plasma film forming operation includes generating plasma and forming a metal oxide layer that is thicker than two atomic layers by a chemical reaction of metal atoms in the physical and chemical adsorption layer and oxygen atoms in the oxidizing agent. The adsorption and stabilization operation and the plasma film forming operation make up one cycle and are repeatedly performed.

The organic metal compound and the oxidizing agent may be injected into the chamber through separate pipes. The organic metal compound may pass through at least one diffuser and may be provided to the substrate.

An embodiment provides a plasma-enhanced chemical vapor deposition device including: a chamber including a bottom plate and a side wall and configured to receive a substrate in an inner space; a cover plate coupled to an upper side of the chamber and including a metal; a high-frequency power supply electrically connected to the cover plate, and configured to allow an on/off operation to be controlled by a controller; a substrate supporter for supporting the substrate in the chamber, the substrate supporter being grounded; a first pipe connected to the cover plate, and configured to supply an organic metal compound into the chamber; and a second pipe connected to the side wall, and configured to supply an oxidizing agent into the chamber.

The high-frequency power supply may be configured to be alternately and repeatedly turned on and off by the controller while the organic metal compound and the oxidizing agent are continuously supplied into the chamber. The controller may be configured to control the on/off operation, an on/off time, and an output voltage of the high-frequency power supply.

The plasma-enhanced chemical vapor deposition device may further include a first diffuser and a second diffuser provided between the cover plate and the substrate with a distance between the first diffuser and the second diffuser. The first diffuser may be provided closer to the cover plate than is the second diffuser. The first diffuser and the second diffuser may include a metal, and the first diffuser and the second diffuser may be fixed to the cover plate to conduct current to the cover plate.

The first pipe may be connected to a center of the cover plate, and a plurality of openings may be provided in the first diffuser. A number of the openings per area of the first diffuser may be different depending on a distance from the first pipe.

The first diffuser may be divided into a central region aligned with the first pipe, an intermediate region provided outside of the central region, and an outer region provided outside of the intermediate region. The number of the openings per area of the first diffuser may be greatest in the outer region and smallest in the central region. The plurality of openings may be disposed in a radial form.

The second pipe may be connected corresponding to a portion between the second diffuser and the substrate on the side wall. A plurality of second pipes may be provided in a radial direction of the chamber.

According to exemplary embodiments, without the purging operation, two operations, that is, the adsorbing and stabilizing operation and the plasma film forming operation make up one cycle, so the during of one cycle is short, and at least two atomic layer films may be formed during each cycle. Therefore, the film forming speed may be increased by greater than ten times, compared to the existing atomic layer deposition process, and the highly dielectric metal oxide layer may be quickly formed.

DETAILED DESCRIPTION

Figure 1:
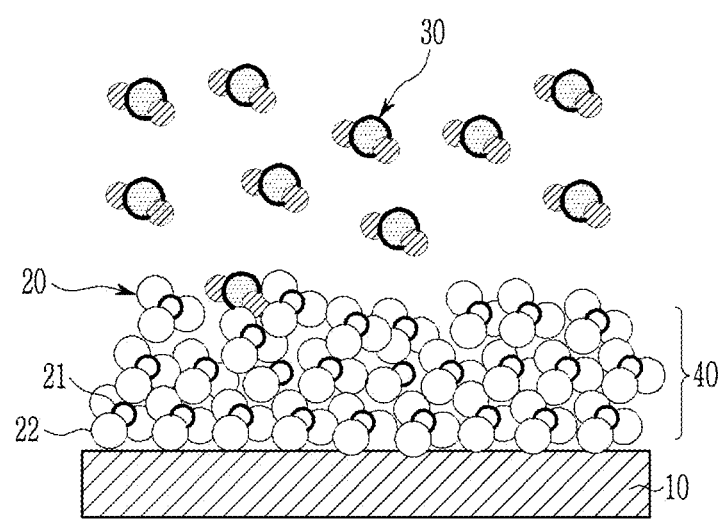
FIG. 1 to FIG. 6 show schematic views of an exemplary embodiment for a method for forming a metal oxide layer.

The present disclosure will be described more fully hereinafter with reference to the accompanying drawings, in which exemplary embodiments of the disclosure are shown. As those skilled in the art would realize, the described embodiments may be modified in various different ways, all without departing from the spirit or scope of the present disclosure.

The drawings and description are to be regarded as illustrative in nature and not restrictive, and like reference numerals designate like elements throughout the specification.

The size and thickness of each configuration shown in the drawings are arbitrarily shown for better understanding and ease of description, and the present disclosure is not limited thereto. In the drawings, the thickness of layers, films, panels, regions, etc., are exaggerated for clarity. For better understanding and ease of description, the thicknesses of some layers and areas are exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

The word "on" or "above" means positioned on or below the object portion, and does not necessarily mean positioned on the upper side of the object portion based on a gravitational direction.

Unless explicitly described to the contrary, the word "comprise" and variations such as "comprises" or "comprising" will be understood to imply the inclusion of stated elements but not the exclusion of any other elements.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." As used herein, the term "and/or" includes any and all combinations of one or more of the associated listed items.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

FIG. 1 to FIG. 6 show schematic views for a method for forming a metal oxide layer according to an exemplary embodiment.

Referring to FIG. 1, a substrate 10 is provided in a chamber (not shown). The substrate 10 may be a display substrate, and the substrate may include a glass sheet or a polymer film. A temperature in the chamber may be in a range of about 100° C. to 450° C., and a pressure in the chamber may be in a range of about 0.01 Torr to 100 Torr. The temperature and the pressure in the chamber are not limited thereto and are changeable in various ways.

An organic metal compound 20 and an oxidizing agent 30 are supplied into the chamber. The organic metal compound 20 and the oxidizing agent 30 may be supplied into the chamber through a pipe (not shown). For example, a pipe for supplying the organic metal compound 20 may be connected to an upper side of the chamber, and a pipe for supplying the oxidizing agent 30 may be connected to a side wall of the chamber.

The organic metal compound 20 may include a metallic center 21 and a plurality of ligands 22 attached to the metallic center 21. The metallic center 21 may include a group 4B metal element, and it may include zirconium (Zr), titanium (Ti), hafnium (Hf), or a combination thereof. In and embodiment, one of Zr, Ti, or Hf is used. The organic metal compound 20 may include $Zr(N(CH_3)_2(C_2H_5))_3$, $Ti(N(CH_3)_2(C_2H_5))_3$, $Hf(N(CH_3)_2(C_2H_5))_3$, $Zr(N(CH_3)C_2H_5)_4$, $Zr(OC(CH_3)_3)_4$, $Hf(N(CH_3)C_2H_5)_4$, $Hf(OC(CH_3)_3)_4$, or a combination thereof. In an embodiment, one of the foregoing is used.

The organic metal compound 20 may also be referred to as source gas or precursor gas, and it may be supplied into the chamber together with an inert carrier gas such as argon (Ar) or nitrogen ($N_2$) or a combination thereof. The organic metal compound 20 may exist as a liquid outside of the chamber, and it may be vaporized and exist as a gas in the chamber.

The oxidizing agent 30 may include a hydroxyl group such as $H_2O$ or $H_2O_2$, it may include oxygen ($O_2$), it may include a compound containing oxygen such as $N_2O$ or $NO_2$, or it may include an activated oxidizing agent for generating oxygen radicals. The activated oxidizing agent may include ozone ($O_3$), $O_2$ plasma, remote $O_2$ plasma, $N_2O$ plasma, or a combination thereof generated by a plasma generator.

The organic metal compound 20 injected into the chamber is chemically adsorbed on the substrate 10 and is physically adsorbed between molecules. Therefore, a physical and chemical adsorption layer 40 including an organic metal compound 20 of a plurality of atomic layers is formed on the substrate 10. For example, the physical and chemical adsorption layer 40 may include an organic metal compound 20 having a thickness of three to five atomic layers. In this instance, one atomic layer means a layer including an atom having a metallic center.

In a conventional atomic layer deposition (ALD) process, remaining portions except for one atomic layer of the adsorption layer may be removed by purging, but in an exemplary embodiment, the organic metal compound is continuously supplied into the chamber without purging. Therefore, the organic metal compound with at least two atomic layers is adsorbed on the substrate 10 and is then stabilized to form a physical and chemical adsorption layer 40. In an exemplary embodiment, a process for forming a physical and chemical adsorption layer 40 on the substrate 10 will be referred to as the adsorption and stabilization operation.

Figure 2:
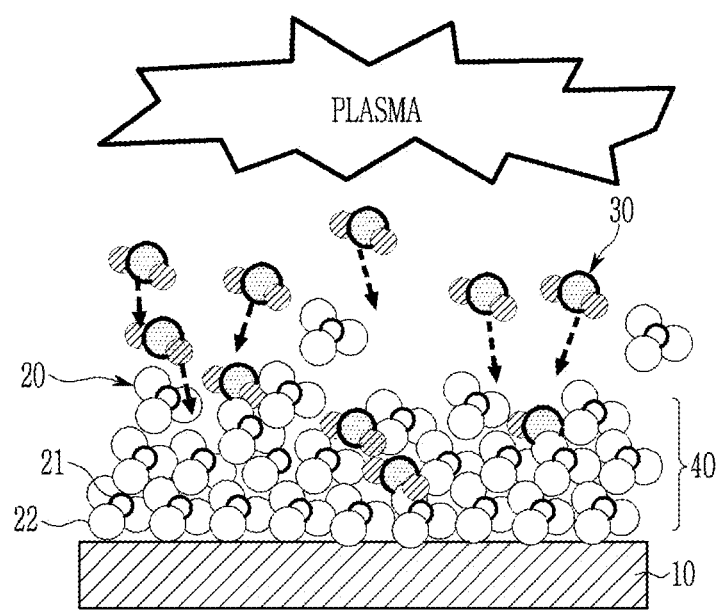
Figure 3:
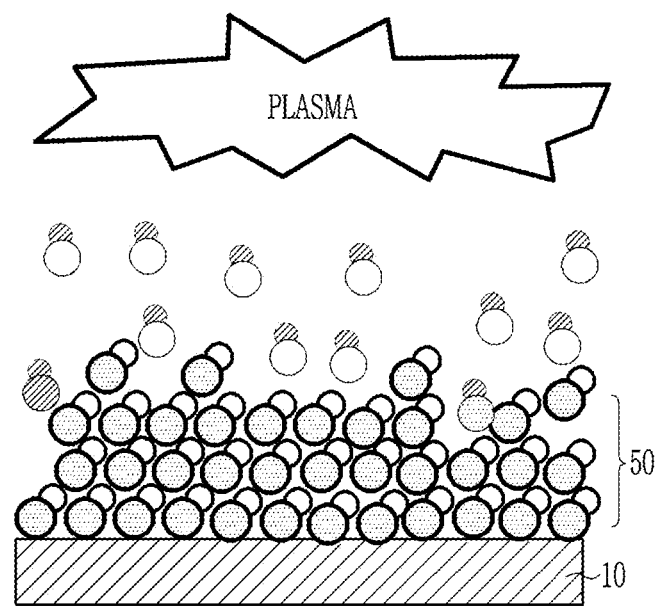

Referring to FIG. 2 and FIG. 3, plasma is generated in the chamber. A driving electrode (not shown) electrically connected to a high-frequency power supply and a ground electrode (not shown) for supporting the substrate 10 are installed in the chamber, and when the high-frequency power supply is turned on, plasma is generated around the substrate 10. The high-frequency power supply has a frequency in a range of several tens of kilohertz to several hundreds of kilohertz.

The organic metal compound 20 and the oxidizing agent 30 are ionized by plasma, and the metal atoms in the physical and chemical adsorption layer 40 chemically react with the oxygen atoms in the oxidizing agent 30.

That is, ligands are exchanged by a chemical reaction of the metallic center 21 and the oxygen atoms, so a plurality of ligands 22 combined, e.g., bound, to the metallic center 21 are swiftly separated, and a metal oxide layer 50 with at least two atomic layers is formed on the substrate 10. For example, a metal oxide layer 50 with a thickness of three to five atomic layers may be formed.

An example of a reaction formula for forming a metal oxide layer 50 by plasma is as follows.

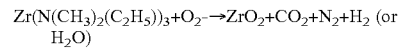

$Zr(N(CH_3)_2(C_2H_5))_3 + O_2^- \rightarrow ZrO_2 + CO_2 + N_2 + H_2$ (or $H_2O$)

In an exemplary embodiment, a process for forming a metal oxide layer 50 including a plurality of atomic layers by allowing metal atoms and oxygen atom to chemically react by generation of plasma will be referred to as a plasma film forming operation. The metal oxide layer 50 may include one of $ZrO_2$, $TiO_2$, and $HfO_2$. The organic metal compound 20 and the oxidizing agent 30 are continuously supplied without distinction of the adsorption and stabilization operation and the film forming operation.

Figure 4:
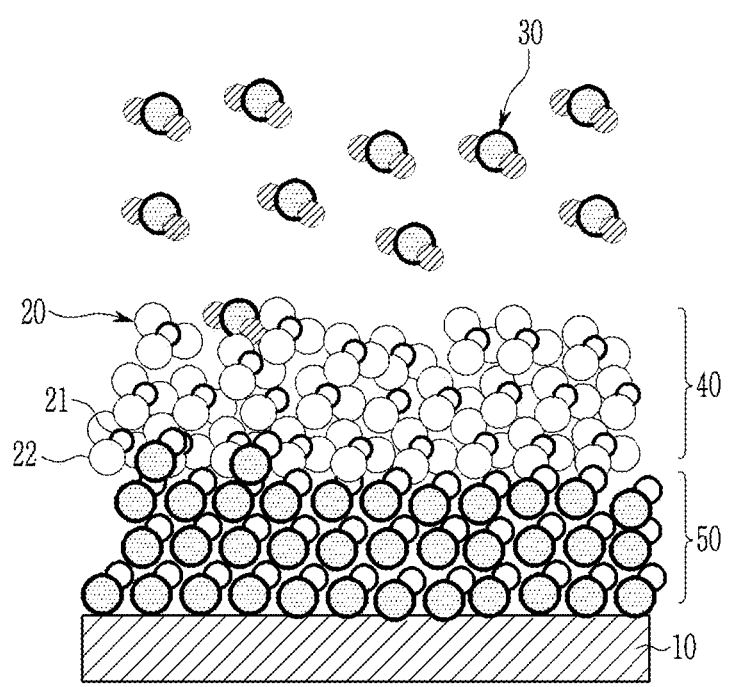
Figure 5:
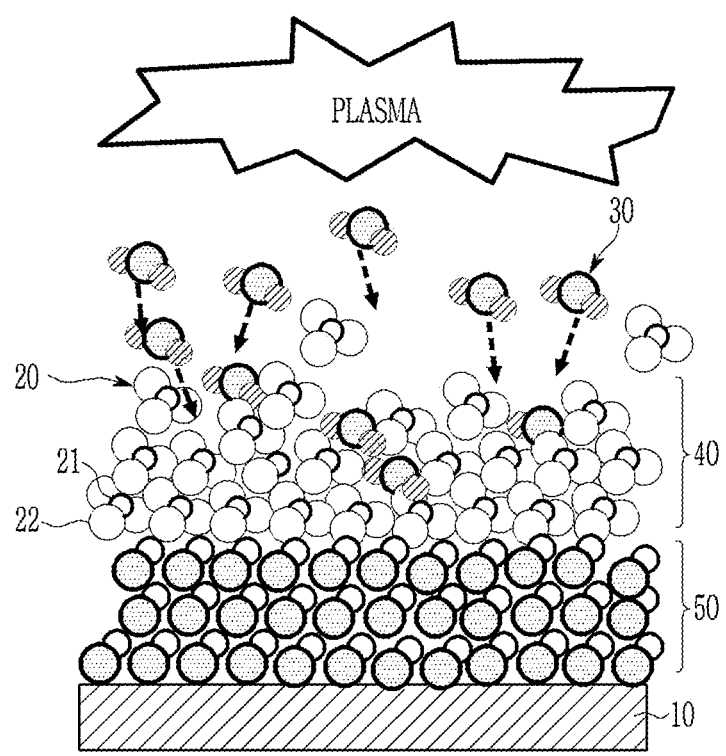
Figure 6:
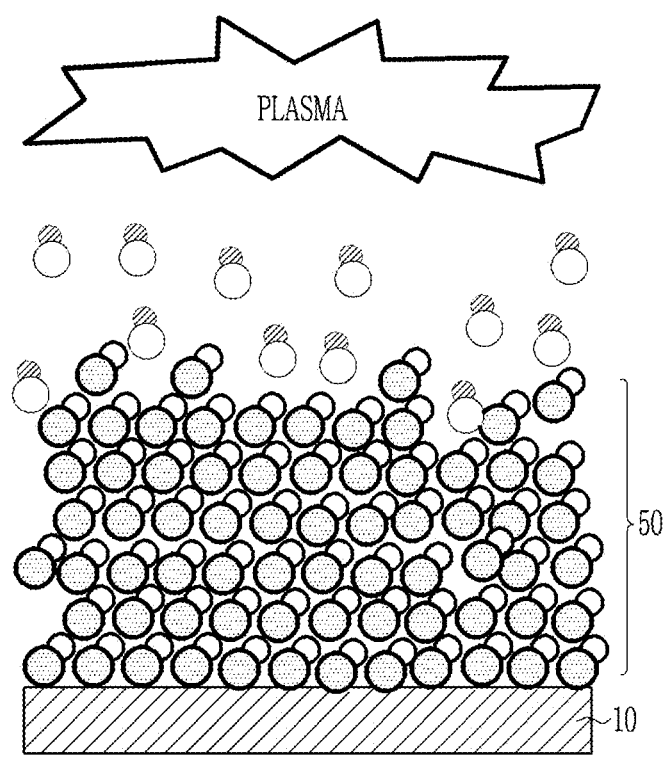

The aforementioned adsorption and stabilization operation and the film forming operation make up one cycle and are repeatedly performed until the metal oxide layer 50 reaches a desired thickness. FIG. 4 shows an adsorption and stabilization operation for second film forming after first film forming, and FIG. 5 and FIG. 6 show a plasma film forming operation for second film forming.

In addition, during the plasma film forming operation, a small amount of reaction by-products such as carbon may remain on the metal oxide layer. However, the content of carbon remaining on the metal oxide layer 50 may be controlled according to a plasma exposure time and an intensity of plasma, and a refractive index or dielectric constant of the metal oxide layer 50 may be controlled to a desired level according to the content of carbon in a like manner of an exemplary embodiment to be described.

Figure 7:
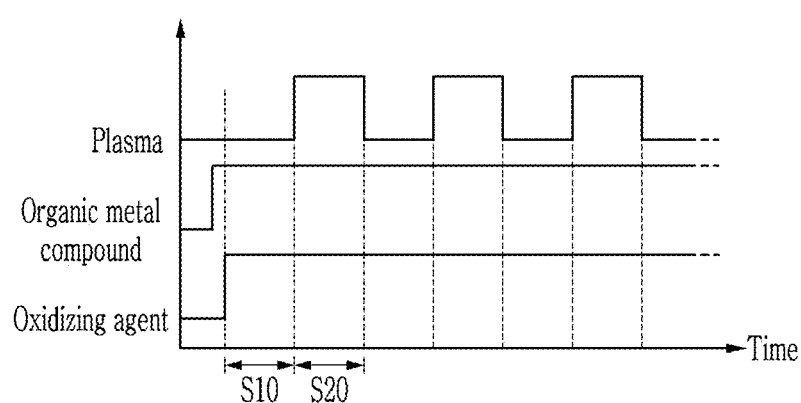
FIG. 7 shows a schematic view of an exemplary embodiment of an order for supplying an organic metal compound and an oxidizing agent, and an on/off period of plasma discharging, in a method for forming a metal oxide layer.

FIG. 7 shows a schematic view of an order for supplying an organic metal compound and an oxidizing agent, and an on/off period of plasma discharging, in a method for forming a metal oxide layer according to an exemplary embodiment.

Referring to FIG. 7, an organic metal compound may be supplied into the chamber stabilized by diffusion, and the oxidizing agent may be supplied into the chamber. When a pressure in the chamber is stabilized by injection of the organic metal compound and the oxidizing agent, the plasma may be alternately and repeatedly turned on and off.

A plasma-off period (S10) represents the aforementioned adsorption and stabilization operation, and a physical and chemical adsorption layer including an organic metal compound including a plurality of atomic layers is formed on the substrate. A plasma-on period (S20) represents the aforementioned plasma film forming operation, and a metal oxide layer including a plurality of atomic layers is formed by a chemical reaction of metal atoms in the physical and chemical adsorption layer and oxygen atoms in the oxidizing agent.

The plasma-off period (S10) and the plasma-on period (S20) may respectively be set to be in a range of about 0.01 seconds to several seconds. The plasma-off period (S10) and the plasma-on period (S20) may have an identical length or duration (time), and the intensity of plasma may have a constant value. The plasma-on/off period corresponds to an on/off operation of the high-frequency power supply, and the length (time) of the plasma-on/off period corresponds to an on/off operation time (duration) of the high-frequency power supply.

In a conventional atomic layer deposition process, four operations may make up one cycle, so the duration of one cycle is long, and one atomic layer may be formed during each cycle. In a conventional atomic layer deposition process, the film forming rate may be about 10 Å/min to 20 Å/min.

However, in the method for forming a metal oxide layer according to an exemplary embodiment, the stages S10 and S20 make up one cycle without a purging operation, so the duration of one cycle is short, and a plurality of atomic layers may be formed during each cycle. In an exemplary embodiment, a film forming rate may be 100 Å to 1000 Å per minute, and a metal oxide layer that is 700 Å thick may be formed within one minute to seven minutes.

By the method according to an exemplary embodiment, a zirconium oxide layer with a content of carbon that is equal to or greater than 5 atomic percent (%) and a zirconium oxide layer with a content of carbon that is less than 5 atomic % may be formed. The zirconium oxide layer with a content of carbon that is equal to or greater than 5 atomic % may have a refractive index of 1.8 to 1.9 and a dielectric constant of 15 to 20. The zirconium oxide layer with a content of carbon that is less than 5 atomic may have a refractive index of 1.9 to 2.1 and a dielectric constant of 20 to 27. As a plasma output increases or the length of time of one cycle increases, the content of carbon in the metal oxide layer reduces, and the refractive index and the dielectric constant increase.

The previously described method according to an exemplary embodiment uses the materials (i.e., the organic metal compound and the oxidizing agent) used in existing conventional atomic layer deposition process, and does not form the metal oxide layer according to the atomic layer deposition method but according to the plasma-enhanced chemical vapor deposition (PECVD) method. A detailed configuration of the PECVD device for forming a metal oxide layer will be described in a latter portion of the present specification.

Figure 8:
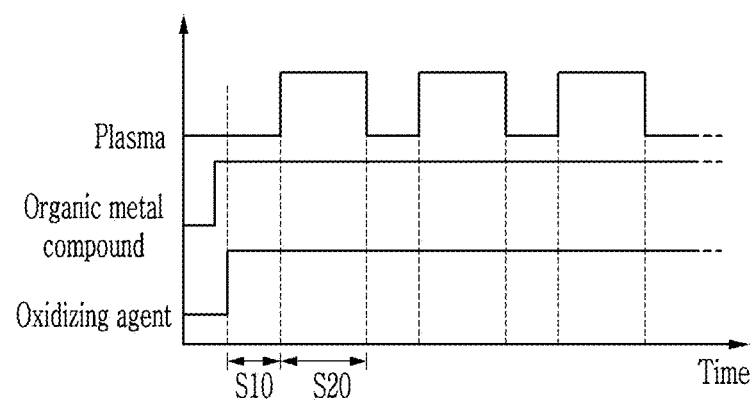
FIG. 8 shows a schematic view of an exemplary embodiment of an order for supplying an organic metal compound and an oxidizing agent, and an on/off period of plasma discharging, in a method for forming a metal oxide layer.

FIG. 8 shows a schematic view of an order for supplying an organic metal compound and an oxidizing agent, and an on/off period of plasma discharging, in a method for forming a metal oxide layer according to an exemplary embodiment.

Referring to FIG. 8, in a method for forming a metal oxide layer according to an exemplary embodiment, the plasma-on period (S20) may have a longer duration than the plasma-off period (S10). In this instance, the intensity of plasma may have a constant value.

The content of carbon remaining on the metal oxide layer changes according to the plasma exposure time in one cycle, and the refractive index and the dielectric constant of the metal oxide layer changes according to the content of carbon. In an exemplary embodiment, by use of the aforementioned characteristic, the plasma-on period (S20) is set to be longer than the plasma-off period (S10) in one cycle to increase the refractive index and the dielectric constant of the metal oxide layer.

Figure 9:
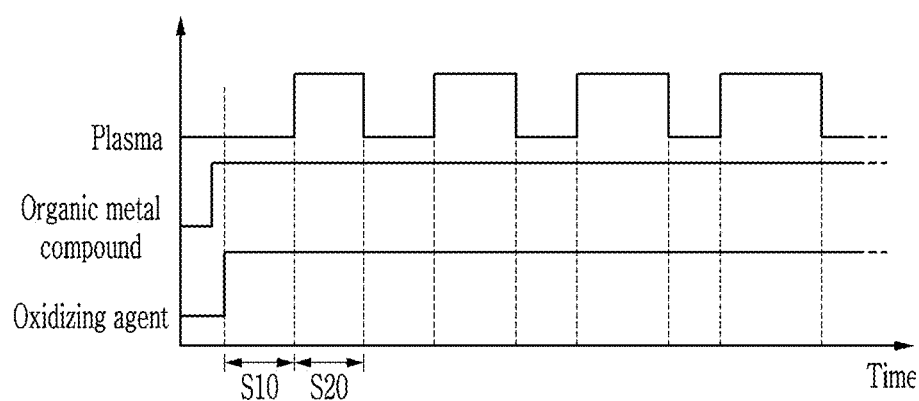
FIG. 9 shows a schematic view of an exemplary embodiment of an order for supplying an organic metal compound and an oxidizing agent, and an on/off period of plasma discharging, in a method for forming a metal oxide layer.

FIG. 9 shows a schematic view of an order for supplying an organic metal compound and an oxidizing agent, and an on/off period of plasma discharging, in a method for forming a metal oxide layer according to an exemplary embodiment.

Referring to FIG. 9, regarding the method for forming a metal oxide layer according to an exemplary embodiment, the plasma-on period (S20) may have a duration that gradually becomes longer in proportion to the increase of the number of cycles. In this instance, the intensity of plasma may have a constant value. In this case, the metal oxide layer has the refractive index or dielectric characteristic that gradually changes in the direction of thickness, which may be applied to optical antireflection layers.

In detail, the plasma-off period (S10) may influence the adsorbed amount of the organic metal compound, and when the plasma-off period (S10) gradually becomes shorter, the adsorbed amount of the organic metal compound may become less, and oxidization by plasma may be easily generated. Resultantly, the content of carbon in the metal oxide layer reduces, and the refractive index and dielectricity may be gradually changed.

Figure 10:
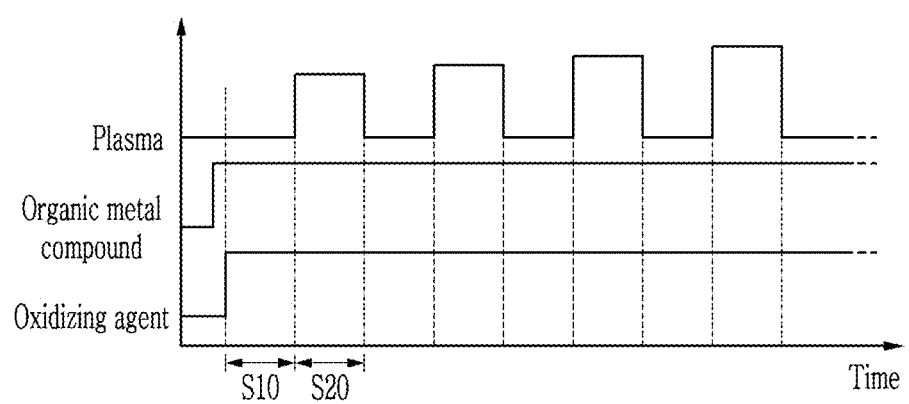
FIG. 10 shows a schematic view of an exemplary embodiment of an order for supplying an organic metal compound and an oxidizing agent, and an on/off period of plasma discharging, in a method for forming a metal oxide layer.

FIG. 10 shows a schematic view of an order for supplying an organic metal compound and an oxidizing agent, and an on/off period of plasma discharging, in a method for forming a metal oxide layer according to an exemplary embodiment.

Referring to FIG. 10, regarding the method for forming a metal oxide layer according to an exemplary embodiment, the intensity of plasma of the plasma-on period (S20) may gradually increase in proportion to the increase of the number of cycles. In this instance, the plasma-off period (S10) and the plasma-on period (S20) may have an identical duration.

The content of carbon of the metal oxide layer changes by the intensity of plasma as well as by the plasma exposure time. In an exemplary embodiment, the refractive index or dielectric characteristic may be changed in the thickness direction of the metal oxide layer by gradually increasing the intensity of plasma as the number of cycles increase.

Figure 11:
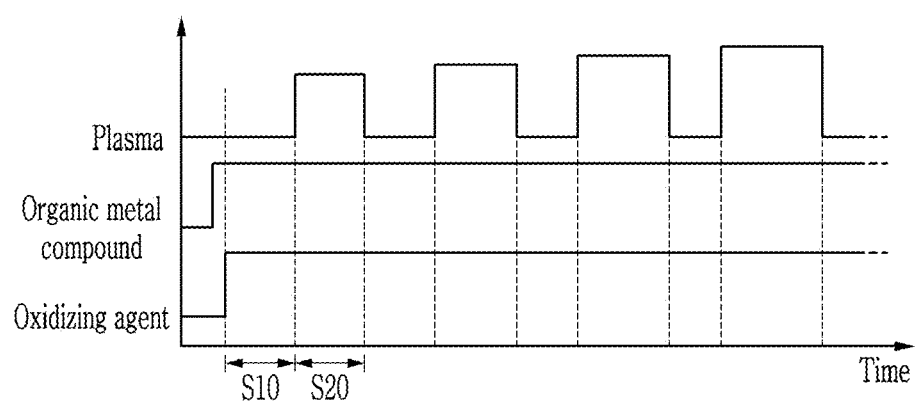
FIG. 11 shows a schematic view of an exemplary embodiment of an order for supplying an organic metal compound and an oxidizing agent, and an on/off period of plasma discharging, in a method for forming a metal oxide layer.

FIG. 11 shows a schematic view of an order for supplying an organic metal compound and an oxidizing agent, and an on/off period of plasma discharging, in a method for forming a metal oxide layer according to an exemplary embodiment.

Referring to FIG. 11, regarding the method for forming a metal oxide layer according to an exemplary embodiment, the plasma-on period (S20) may have a duration that gradually becomes longer in proportion to the increase of the number of cycles, and the intensity of plasma may gradually increase in proportion to the increase of the number of cycles.

The metal oxide layer formed according to an exemplary embodiment has the refractive index or dielectric characteristic that gradually changes in the thickness direction, and a degree of change of the refractive index or dielectricity in the thickness direction is greater than the case of the metal oxide layer formed according to the methods according to exemplary embodiments shown in FIGS. 9 and 10.

A configuration of a plasma-enhanced chemical vapor deposition (PECVD) device (a PECVD device hereinafter) for forming a metal oxide layer will now be described.

Figure 12:
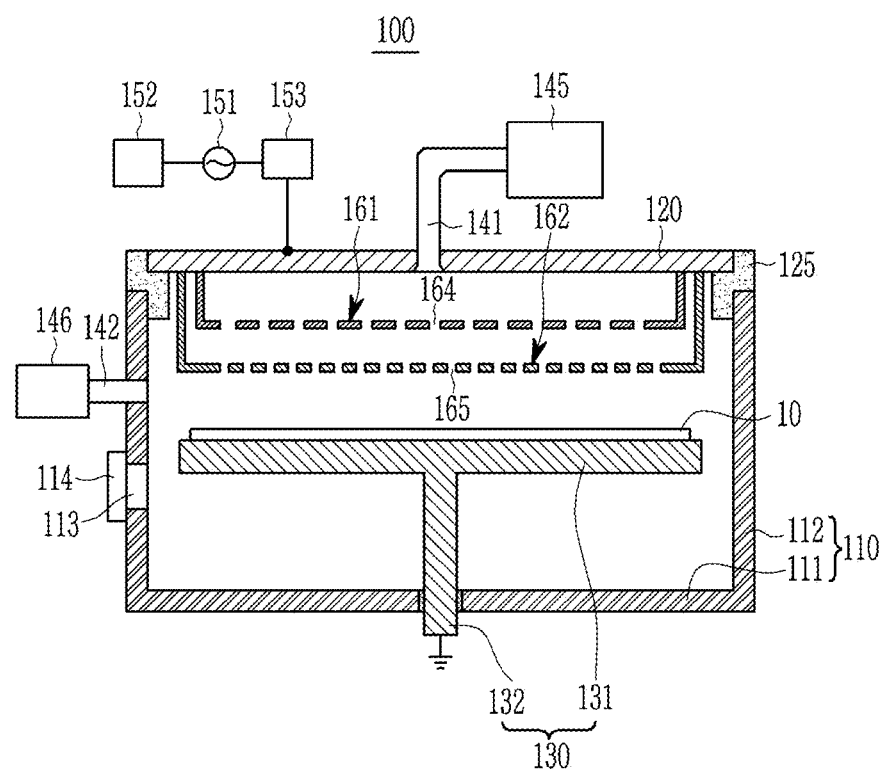
FIG. 12 shows a schematic diagram of an exemplary embodiment of a plasma-enhanced chemical vapor deposition device.

FIG. 12 shows a schematic diagram of a PECVD device according to an exemplary embodiment.

Referring to FIG. 12, the PECVD device 100 according to an exemplary embodiment includes a chamber 110 having an inner space, a cover plate 120 coupled to an upper side of the chamber 110, a substrate supporter 130 for supporting the substrate 10 in the chamber 110, a first pipe 141 for supplying an organic metal compound into the chamber 110, and a second pipe 142 for supplying an oxidizing agent into the chamber 110.

The chamber 110 may be in the form of a vessel having an upper side that is opened, and may include a bottom plate 111 and a side wall 112 connected to an edge of the bottom plate 111. A substrate path 113 on which the substrate 10 moves is provided on the side wall 112 of the chamber 110, and a door unit 114 for opening or closing the substrate path 113 may be installed on the side wall 112.

The substrate supporter 130 may include a chuck 131 for supporting the substrate 10, and a support portion 132 for penetrating through the bottom plate 111 of the chamber 110 and movable upward and downward by a driving device. The substrate supporter 130 includes a metal, and is connected to a ground source and functions as a ground electrode. The chuck 131 may be an electrostatic chuck for fixing the substrate 10 by using an electrostatic force, or a vacuum chuck for fixing the substrate 10 by using a vacuum pressure.

The cover plate 120 may be coupled to the opened upper side of the chamber 110 with an insulator 125 as a medium, e.g., between the chamber 110 and the cover plate 120. The cover plate 120 includes a metal, and is electrically connected to a high-frequency power supply 151 and functions as a driving electrode.

The on/off operation of the high-frequency power supply 151 is controlled by a controller 152, and a matching box 153 for increasing high-frequency transmission efficiency may be formed between the high-frequency power supply 151 and the cover plate 120. The controller 152 may control an on/off operation, an on/off time, and an output voltage of the high-frequency power supply 151.

A conventional CVD device and the PECVD device for forming a silicon oxide layer or a silicon nitride include a single pipe for inputting a process gas (e.g., a mixed gas of $SiH_4$ and $NH_3$ or a mixed gas of $SiH_4$ and $N_2O$).

However, the organic metal compound and the oxidizing agent for forming a highly dielectric metal oxide layer have high reactivity, so the organic metal compound and the oxidizing agent cannot be mixed in advance and input, e.g., fed, to a single pipe. Therefore, the PECVD device 100 separately includes the first pipe 141 for injecting the organic metal compound and the second pipe 142 for injecting the oxidizing agent.

In detail, the first pipe 141 may be connected to a center of the cover plate 120, and a first gas supply unit 145 supplies the organic metal compound into the chamber 110 through the first pipe 141. The second pipe 142 may be connected to the side wall 112 of the chamber 110, and a second gas supply unit 146 supplies the oxidizing agent into the chamber 110 through the second pipe 142.

In this instance, the organic metal compound is a heavy material that has a molecular weight that is equal to or greater than 200. For uniform diffusion of the organic metal compound, a plurality of diffusers (perforated plates) may be provided between the cover plate 120 and the substrate 10. FIG. 12 exemplifies a first diffuser 161 and a second diffuser 162 separated from each other with a distance therebetween.

The first diffuser 161 and the second diffuser 162 are fixed to the cover plate 120, and may include a metal and may conduct current or electricity to the cover plate 120. In this case, the first diffuser 161 and the second diffuser 162 as well as the cover plate 120 may function as driving electrodes when the high-frequency power supply 151 is turned on.

The organic metal compound injected through the first pipe 141 passes through an opening 164 of the first diffuser 161 and is diffused for the first time, and passes through an opening 165 of the second diffuser 162 and is diffused for the second time, so that the organic metal compound injected through the first pipe 141 may be uniformly diffused on the entire upper side of the substrate 10.

Figure 13:
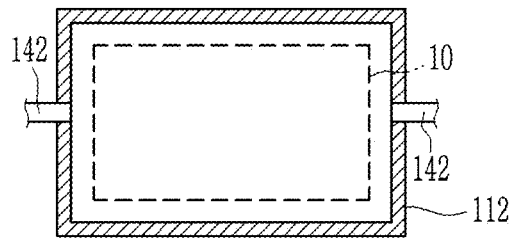
FIG. 13 and FIG. 14 show schematic diagrams of an example of disposing a second pipe of a plasma-enhanced chemical vapor deposition device shown in FIG. 12.
Figure 14:
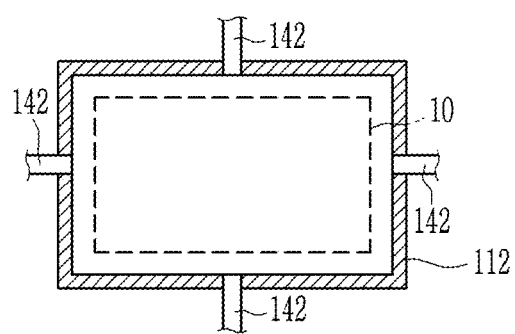

The second pipe 142 may be connected to a corresponding portion between the second diffuser 162 and the substrate 10 on the side wall 112 of the chamber 110, and there may be a plurality of second pipes 142 in a circumferential direction of the chamber 110. For example, as shown in FIG. 13, two second pipes 142 may be disposed to correspond to two sides of the substrate 10. On the other hand, as shown in FIG. 14, four second pipes 142 may be disposed to correspond to four sides of the substrate 10.

The PECVD device 100 according to an exemplary embodiment may uniformly spread the organic metal compound on the substrate 10 by use of the first diffuser 161 and the second diffuser 162, and may uniformly spread the oxidizing agent by supplying the oxidizing agent toward the substrate 10 in at least two directions. Therefore, the metal oxide layer having a uniform film characteristic may be formed on the substrate 10.

The PECVD device 100 according to an exemplary embodiment may continuously supply the organic metal compound and the oxidizing agent into the chamber 110, may form a highly dielectric metal oxide layer on the substrate 10 according to repetition of the on/off operation of the high-frequency power supply 151 by operation of the controller 152, and may realize, e.g., provide, a film forming speed of 100 Å to 1000 Å per minute.

Figure 15:
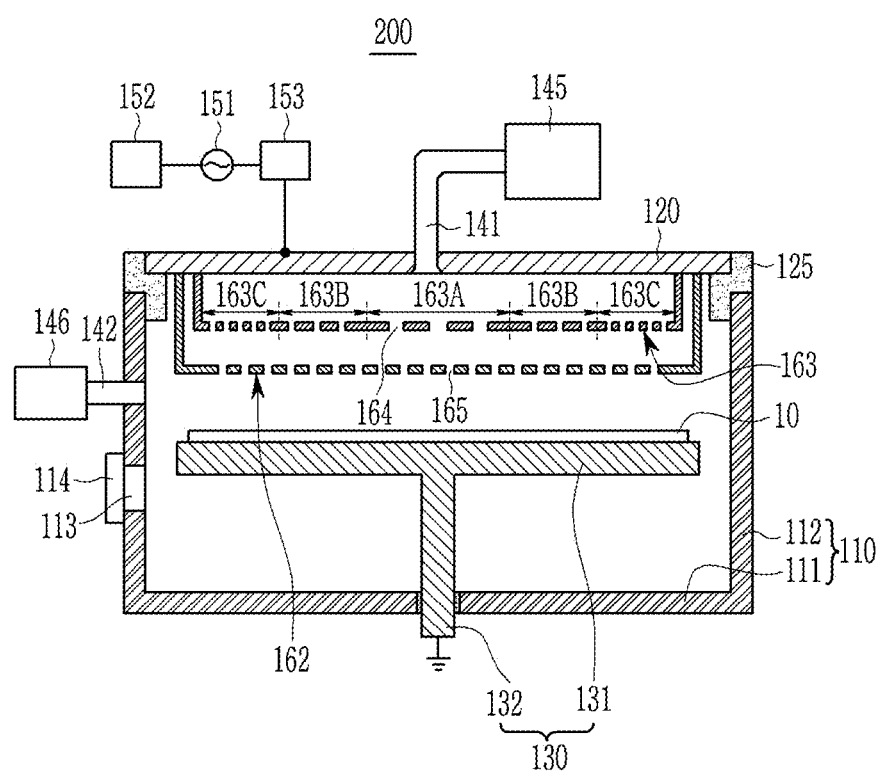
FIG. 15 shows a schematic diagram of an exemplary embodiment of a plasma-enhanced chemical vapor deposition device.
Figure 16:
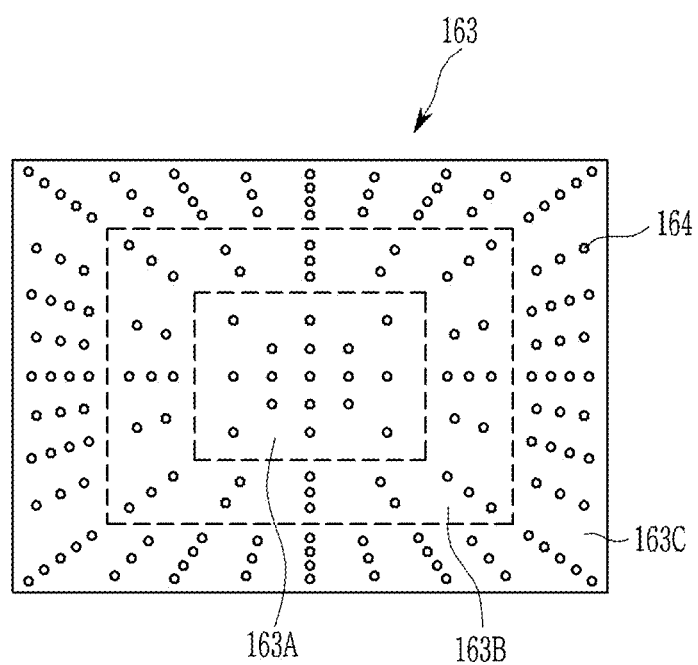
FIG. 16 shows a top plan view of a first diffuser of a plasma-enhanced chemical vapor deposition device shown in FIG. 15.

FIG. 15 shows a schematic diagram of a PECVD device according to an exemplary embodiment, and FIG. 16 shows a top plan view of a first diffuser of a PECVD device shown in FIG. 15.

Referring to FIG. 15 and FIG. 16, regarding the PECVD device 200 according to an exemplary embodiment, a first diffuser 163 is divided into a plurality of regions with different numbers of the openings per area, e.g., aperture ratios. In detail, the first diffuser 163 may be divided into a central region 163A, an intermediate region 163B, and an outer region 163C, and the number of the openings per area may be greatest in order of the outer region 163C, the intermediate region 163B, and the central region 163A, e.g., the number of the openings per area may be greatest in the outer region 163C and smallest in the central region 163A.

The first pipe 141 faces the central region 163A of the first diffuser 163, so a large amount of the organic metal compound is supplied to the central region 163A. The central region 163A has the lowest aperture ratio, so the amount of the organic metal compound moved to the intermediate region 163B becomes greater than the amount of the organic metal compound passing through the opening 164 of the central region 163A.

Part of the organic metal compound moved to the intermediate region 163B passes through the opening 164 of the intermediate region 163B, and the rest thereof is moved to the outer region 163C. The organic metal compound moved to the outer region 163C may freely pass through the opening 164 of the outer region 163C with the greatest aperture ratio.

Resultantly, the amounts of the organic metal compound passing through the central region 163A, the intermediate region 163B, and the outer region 163C may be substantially the same as each other by precisely controlling the number of the openings per area of respective regions based on the pressure of the chamber 110 and the supplied amount of the organic metal compound. On the other hand, the amount of the organic metal compound passing through the outer region 163C may be controlled to be greater than the amount of the organic metal compound passing through the central region 163A or the intermediate region 163B.

In this instance, the opening 164 of the first diffuser 163 may be disposed in a radial form (a direction extending to an edge from a center) to thus induce uniform diffusion of the organic metal compound in the radial direction. The second diffuser 162 may include a plurality of openings 165 disposed in a uniform manner, and the aperture ratio of the second diffuser 162 may be greater than the maximum aperture ratio of the first diffuser 163, that is, the aperture ratio of the outer region 163C.

In general, a distance that the organic metal compound supplied to the first pipe 141 travels becomes greater as the organic metal compound travels to the edge of the substrate 10, and the intensity of plasma becomes less as the organic metal compound travels to the edge of the substrate 10. Therefore, the film forming rate on the edge of the substrate 10 may be less than the film forming rate at the center thereof because of the increase of the distance that the organic metal compound travels and the reduction of the intensity of plasma. Such a difference of film forming rates generates a non-uniform thickness of the metal oxide layer.

However, regarding the PECVD device 200 according to an exemplary embodiment, the amount of the organic metal compound supplied to the edge of the substrate 10 may be increased by control of the aperture ratio of the first diffuser 163, and a deterioration of the film forming rate occurring at the edge of the substrate 10 may be compensated. As a result, the PECVD device according to an exemplary embodiment may facilitate the uniform thickness of the metal oxide layer and is advantageous in the large-area film forming process.

The PECVD device 200 according to an exemplary embodiment is formed with the same configuration as that according to the exemplary embodiment shown in FIG. 12 except for the pattern of the opening 164 of the first diffuser 163.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method for forming a metal oxide layer, the method comprising:
repeatedly causing a plasma-off period and a plasma-on period while an organic metal compound and an oxidizing agent are continuously injected into a chamber to form the metal oxide layer, and
decreasing a duration of the plasma-off period and increasing a duration of the plasma-on period in proportion to an increase in a number of cycles,
wherein one cycle comprises one plasma-off period and one plasma-on period,
wherein the organic metal compound and the oxidizing agent are continuously injected into a chamber during the plasma-off period and the plasma-on period, and
wherein the plasma-on period has a longer duration than the plasma-off period.

2. The method of claim 1, wherein:
an intensity of plasma has a constant value during plasma-on periods.

3. The method of claim 1, wherein:
an intensity of plasma during plasma-on periods increases in proportion to an increase in the number of cycles.

4. The method of claim 1, wherein:
the organic metal compound and the oxidizing agent are injected into the chamber by separate pipes, and
the organic metal compound passes through at least one diffuser and is provided to a substrate.

5. The method of claim 1, wherein
the organic metal compound and the oxidizing agent are injected into the chamber through separate pipes.

6. The method of claim 5, wherein
the organic metal compound passes through at least one diffuser and is provided to a substrate.

7. A plasma-enhanced chemical vapor deposition device for forming a metal oxide layer according to claim 1, comprising:
the chamber including a bottom plate and a side wall and configured to receive a substrate in an inner space;
a cover plate coupled to an upper side of the chamber and comprising a metal;
a high-frequency power supply electrically connected to the cover plate, and configured to allow an on/off operation controlled by a controller;
a substrate supporter for supporting the substrate in the chamber, the substrate supporter being grounded;
a first pipe connected to the cover plate, and configured to supply an organic metal compound into the chamber; and
a second pipe connected to the side wall, and configured to supply an oxidizing agent into the chamber.

8. The plasma-enhanced chemical vapor deposition device of claim 7, wherein
the high-frequency power supply is configured to be alternately and repeatedly turned on and off by the controller while the organic metal compound and the oxidizing agent are continuously supplied into the chamber.

9. The plasma-enhanced chemical vapor deposition device of claim 8, wherein
the controller is configured to control the on/off operation, an on/off time, and an output voltage of the high-frequency power supply.

10. The plasma-enhanced chemical vapor deposition device of claim 7, further comprising
a first diffuser and a second diffuser provided between the cover plate and the substrate with a distance between the first diffuser and the second diffuser,
wherein the first diffuser is provided closer to the cover plate than is the second diffuser.

11. The plasma-enhanced chemical vapor deposition device of claim 10, wherein
the first diffuser and the second diffuser comprise a metal, and the first diffuser and the second diffuser are fixed to the cover plate to conduct current to the cover plate.

12. The plasma-enhanced chemical vapor deposition device of claim 10, wherein:
the first pipe is connected to a center of the cover plate,
a plurality of openings are provided in the first diffuser, and
a number of the openings per area of the first diffuser is different depending on a distance from the first pipe.

13. The plasma-enhanced chemical vapor deposition device of claim 12, wherein:
the first diffuser is divided into a central region aligned with the first pipe, an intermediate region provided outside of the central region, and an outer region provided outside of the intermediate region, and
the number of the openings per area of the first diffuser is greatest in the outer region and smallest in the central region.

14. The plasma-enhanced chemical vapor deposition device of claim 13, wherein
the plurality of openings are disposed in a radial form.

15. The plasma-enhanced chemical vapor deposition device of claim 10, wherein
the second pipe is connected to a portion of the side wall between the second diffuser and the substrate.

16. The plasma-enhanced chemical vapor deposition device of claim 15, wherein
a plurality of second pipes are provided in a radial direction of the chamber.

17. The method of claim 1, wherein the metal oxide layer is formed at a rate of 100 Å to 1000 Å per minute.

18. The method of claim 1, wherein the metal oxide layer comprises a zirconium oxide layer.

19. The method of claim 18, wherein the zirconium oxide layer has a refractive index of 1.9 to 2.1 and a dielectric constant of 20 to 27.

20. The method of claim 19, wherein decreasing the duration of the plasma-off period and increasing the duration of the plasma-on period in proportion to the increase in the number of cycles increases the refractive index of the zirconium oxide layer to 1.9 to 2.1 and increases the dielectric constant of the zirconium oxide layer to 20 to 27.

* * * * *